United States Patent
Cooney, III et al.

(10) Patent No.: US 6,214,730 B1
(45) Date of Patent: *Apr. 10, 2001

(54) FLUORINE BARRIER LAYER BETWEEN CONDUCTOR AND INSULATOR FOR DEGRADATION PREVENTION

(75) Inventors: Edward C. Cooney, III, Jericho; Hyun K. Lee, Essex Junction; Thomas L. McDevitt, Underhill; Anthony K. Stamper, Williston, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/257,372

(22) Filed: Feb. 25, 1999

Related U.S. Application Data

(62) Division of application No. 08/937,367, filed on Sep. 25, 1997, now Pat. No. 6,066,577, and a division of application No. 08/937,622, filed on Sep. 25, 1997, now Pat. No. 5,930,655, and a division of application No. 08/744,846, filed on Nov. 8, 1996.

(51) Int. Cl.$^7$ .................................................. H01L 21/44
(52) U.S. Cl. ........................................... 438/681; 438/474
(58) Field of Search ..................... 438/474, 681

(56) References Cited

U.S. PATENT DOCUMENTS

| | | |
|---|---|---|
| 4,300,989 | 11/1981 | Chang . |
| 5,011,732 | 4/1991 | Takeuchi et al. . |
| 5,219,791 | 6/1993 | Freiberger . |
| 5,306,671 | 4/1994 | Ogawa et al. . |
| 5,380,397 | 1/1995 | Fukuyama et al. . |
| 5,384,281 | 1/1995 | Kenney et al. . |
| 5,397,748 | 3/1995 | Watanabe et al. . |
| 5,423,945 | 6/1995 | Marks et al. . |
| 5,451,543 | 9/1995 | Woo et al. . |
| 5,466,638 | 11/1995 | Eguchi . |
| 5,497,545 | 3/1996 | Watanabe et al. . |
| 5,527,718 * | 6/1996 | Seita ........................................ 437/11 |
| 5,644,166 | 7/1997 | Honeycutt et al. . |
| 5,661,334 | 8/1997 | Akram . |
| 5,753,564 | 5/1998 | Fukada .................................. 437/238 |
| 5,930,655 * | 7/1999 | Cooney, III ........................... 438/474 |

FOREIGN PATENT DOCUMENTS 94-12488   6/1994 (KR) .

OTHER PUBLICATIONS

C. Dalton; Enhanced Selective Tungsten Encapsulation of TiW Capped Aluminum Interconnect; WMIC Conf. Jun. 12–13, 1990; pp. 289–295.

\* cited by examiner

*Primary Examiner*—Matthew Smith
*Assistant Examiner*—Chuong Luu
(74) *Attorney, Agent, or Firm*—McGuireWoods, LLP; Mark F. Chadurjian, Esq.

(57) ABSTRACT

Method of improving the resistance of a metal against degradation from exposure to fluorine released from a fluorine-containing material by forming a fluorine-barrier layer between the insulator material and the metal. The invention is especially useful in improving corrosion and poisoning resistance of metallurgy, such as aluminum metallurgy, in semiconductor structures. The invention also covers integrated circuit structures made by this method.

3 Claims, 5 Drawing Sheets

FLUORINE BARRIER LAYER BETWEEN CONDUCTOR AND INSULATOR FOR DEGRADATION PREVENTION

CROSS-REFERENCE TO RELATED APPLICATIONS

This application is a divisional of the following patent applications, and the complete contents of each application is herein incorporated by reference: U.S. Ser. No. 08/744,846 filed Nov. 8, 1996, U.S. Ser. No. 08/937,367 filed Sep. 25, 1997 now U.S. Pat. No. 6,066,577 and U.S. Ser. No. 08/937,622 filed Sep. 25, 1997 now U.S. Pat. No. 5,930,655.

BACKGROUND OF THE INVENTION

1. Field of the Invention

The present invention generally relates to semiconductor devices and manufacturing and, more particularly, to methods and structures which prevent degradation in semiconductor device wiring.

2. Background Description

Degradation occurs in metal lines in contact with insulator materials containing fluorine. This degradation is a serious concern because it represents a potential failure mechanism for an IC (integrated circuit). The degradation problem is costly to the industry by virtue of the process monitoring, inspections, and equipment maintenance requirements that it entails. No understanding of, much less a solution to, the degradation problem associated with metal lines in contact with insulators containing fluorine has been developed prior to the present invention.

SUMMARY OF THE INVENTION

It is therefore an object of the present invention to provide degradation resistance for metals in contact with fluorine-containing insulator materials.

It is another object of the present invention to provide corrosion resistance for aluminum lines in contact with oxide insulator lines containing fluorine.

It is yet another objective of this invention to prevent fluorine poisoning of metals used in IC metallization schemes to prevent undesired via resistance growth and to enhance the contact between a metallization layer and the metal in a via plug.

These and other objectives are achieved in the present invention by providing a fluorine-free barrier layer between an insulator material containing fluorine and a metal to effectively restrict diffusion of fluorine from the insulator material into the metal; thereby preventing metal degradation.

For purposes of the present invention, the terminology "degradation", as used in connection with metal contact and metal-based conductors of electricity, encompasses "corrosion" or "poisoning" of a metal. "Corrosion" of a metal line or metal contact by exposure to fluorine means formation of a metal fluoride compound from fluorine and the metal via chemical reaction. "Poisoning" of a metal by exposure to fluorine means physical infiltration of the metal by fluorine as a contaminant in an amount adequate to increase the contact resistance of the contaminated metal interfaces.

While not desiring to be bound to any particular theory, it is thought that fluorine-containing insulating materials tend to release fluorine constituents during patterning of metal lines and metal conductors, particularly in the form of fluorine (F) or fluorine gas ($F_2$), which initiates and/or promotes the corrosion and/or poisoning of metals, such as aluminum or titanium, that become exposed to and infiltrated by the released fluorine. This phenomenon has been observed to occur whether the fluorine is an intentional component of the insulator material or even an inadvertent contaminant thereof. For instance, fluorine has been found by the present investigators to be a contaminant in commonly-used TEOS (i.e., tetraethylorthosilicate) based insulator films which are commonly-used as insulating films between metal conductor lines. The presence of fluorine as a contaminant in the insulator layer nonetheless poses a potential degradation threat, once released, to adjacent metal conductor lines if not prevented by use of the intervening barrier layer employed in this invention.

It has been observed by the investigators of this invention that the rate of corrosion experienced in metal exposed to fluorine is positively related to the concentration of fluorine in the adjoining insulator film; that is, a lower-concentration of fluorine in the insulator film causes less metal corrosion than the case where higher concentrations of fluorine are present in the insulator film.

In this invention, a fluorine-free barrier layer is formed at the surface of an insulator film, such as a silicon oxide, silicon nitride, silicon, or carbon film, before a metal conductor layer is formed on the barrier layer and patterned to form circuitry wiring. In the present invention, it is imperative that the fluorine-free barrier layer material itself is free of fluorine and it should not emit fluorine or allow migration of fluorine therethrough during metal etching, resist stripping, cleaning, annealing, and other procedures associated with metallization operations. The term "fluorine-free" means no amount of fluorine present, although it is conceivable that a trace amount of contaminant fluorine could be present in an amount so minuscule that it would pose no bona fide degradation threat to impair the function(s) of metal conductor lines and via metals formed on or in the insulator film. Accordingly, the terminology "fluorine-free" should be construed in this light. The fluorine-free barrier material also should have dielectric properties compatible with BEOL (back end of the line) processing requirements and should be compatible with standard via processes.

The fluorine-free barrier layer can be formed in two different ways: one being basically an additive process while the other is subtractive in nature. As an additive technique, the barrier layer can be formed as an extraneous layer that is deposited upon the exposed surface of the fluorine-containing insulator material. Fluorine-free barrier materials which may be deposited to form a film include fluorine-free silane or TEOS-based films prepared in such a way as to minimize the fluorine contaminants. Other fluorine-free barrier materials which can be deposited as films in the practice of this invention include sputter-deposited oxides, plasma enhanced chemical vapor deposited silicon nitride, intrinsic physical vapor deposited silicon, undoped silicon oxide, vapor deposited amorphous carbon, and other like materials, that are free of fluorine.

As a subtractive technique for forming the fluorine-free barrier layer, it can be formed by modifying the composition of the surface regions of fluorine-containing material by denuding its fluorine content to effectively form an insulator material having a fluorine-rich interior and a fluorine-free exterior barrier layer. To form the fluorine-free barrier layer in this manner, the fluorine-containing insulator material can be annealed in hydrogen gas with or without plasma, or alternatively, can be exposed to a plasma of oxygen or ozone, to deplete and cause elimination of fluorine from the surface regions of a fluorine-containing insulator material to create a fluorine-free layer in the surface regions of the insulator material. With such hydrogen annealing, it is thought that HF gas is formed which evolves from the surface of the insulator material to provide the fluorine-free region. On the other hand, and although the exact mechanism is not completely understood at this time, it is theorized that the oxygen or ozone plasma brings about the formation of SiF or F gas, which evolves from the surface region of the insulator material to be replaced by fluorine-free SiO.

Whether formed by the additive or subtractive modes of this invention, the fluorine-free barrier layer must have a thickness adequate to preclude migration of fluorine therethrough. In general, the thickness of the fluorine-free barrier layer will depend on the barrier material and its particular morphology. The thickness of the fluorine-free barrier layer generally ranges from 1 nm to 300 nm.

In further embodiment of this invention, the fluorine-free barrier layer is especially useful in a situation where insulator films are intentionally doped with fluorine for the purpose of reducing the dielectric constant of the insulator films in order to reduce capacitive coupling between adjacent metal lines. This situation is contemplated in BEOL (back end of the line) technologies. In this embodiment of the invention, the fluorine-free barrier layer is formed between the fluorine-rich insulator film and the metal conductor lines to thwart the heightened corrosion dangers otherwise posed to metal lines.

In another further embodiment of the invention, the fluorine-barrier layer is used to decrease via resistance by enhancing the contact between the first metallization layer and the metal in the via. For instance, in this embodiment, the fluorine-free barrier layer can be formed at the surface of a fluorine-containing oxide surrounding a via to enhance the contact of a via metal to the first level metal by preventing "poisoning" of via metal(s), such as AlCu/TiN/Ti/W, AlCu/Ti/AlCu, or Cu/Ta/TaN/Cu, and concomitant loss of via metal adhesion due to fluorine exposure. This embodiment effectively prevents via resistance from increasing.

The metals that can be protected from fluorine degradation by the present invention include any metal or metal alloy that is susceptible to degradation in the presence of fluorine. Metals that can be protected from fluorine-induced degradation by the present invention include, for example, aluminum and alloys of aluminum such as Al—Si, Al—Cu, Al—Si—Cu, copper and alloys of copper such as Cu—Sn, Au and Au-based alloys (e.g., Au—Ge), nickel and nickel alloys, chromium, $CrSi_2$, germanium, molybdenum, $MoSi_2$, palladium, $PdSi_2$, platinum, PtSi, tantalum, $TaSi_2$, titanium, TiN, Ti—Pt, Ti—W, $TiSi_2$, tungsten, $WSi_2$, WN, $ZrSi_2$, and the like. Aluminum or copper, and alloys thereof, in particular, are used extensively in multilevel metallization schemes in VLSI technology because aluminum or copper is ideal for ohmic contacts and bonds readily to silicon, polysilicon, silicides and surface silica layers. However, since aluminum-containing metals and copper-containing metals are also especially prone to fluorine-induced corrosion, this invention is particularly useful in protecting this metal material.

The present invention is easily integrated into and compatible with multilevel metallization schemes that are so important in VSLI technology. In general, only one additional step, viz., the fluorine-free barrier layer formation itself, need be incorporated into the process. Moreover, since the present invention is a robust technique for preventing degradation in metal wiring lines and metallization interconnect features, considerable cost savings are achieved due to lowered failure rates and degradation monitoring requirements.

BRIEF DESCRIPTION OF THE DRAWINGS

The foregoing and other objects, aspects and advantages will be better understood from the following detailed description of the preferred embodiments of the invention with reference to the drawings, in which.

The drawings are not necessarily drawn to scale, as the thicknesses of the various layers are shown for clarity of illustration and should not be interpreted in a limiting sense.

DETAILED DESCRIPTION OF THE PREFERRED EMBODIMENTS OF THE INVENTION

Figure 1:
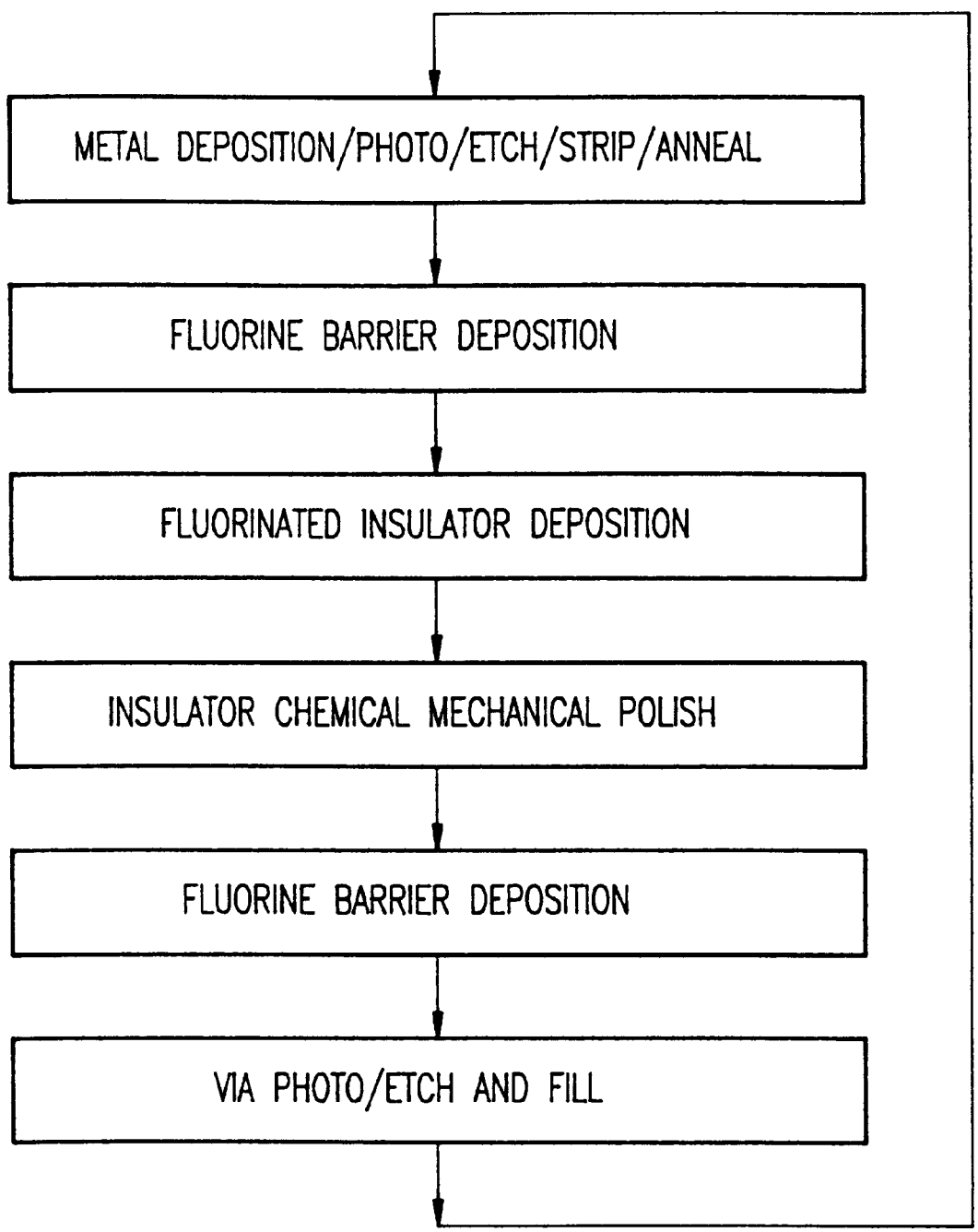
FIG. 1 is a flow chart showing the steps of one embodiment of the invention relating to additive formation of the fluorine barrier layer.

Referring now to the drawings, and more particularly to FIG. 1, there is shown a flow chart of one embodiment of the inventive method relating to additive formation of the fluorine-free barrier layer. The inventive processing sequence as summarized in FIG. 1 proceeds according to the following sequence of steps:

(a) metal wiring pattern formation by the sequentially executed substeps of metal deposition/photolithographic masking/etching/mask stripping/annealing;

(b) fluorine barrier deposition (lower layer);

(c) fluorinated insulator deposition;

(d) insulator chemical mechanical polish;

(e) fluorine barrier deposition (upper layer);

(f) contact formation by photolithographic masking/via formation by etching/via filling with metal and second level wiring formation; and repeat steps (a)–(f) for any additional desired levels of metallization.

Figure 2A:
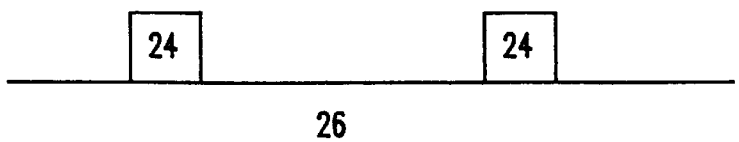
FIGS. 2A–2F show cross-sectional views of a semiconductor device at several different processing stages of the embodiment of the present invention described in the flow chart of FIG. 1.
Figure 2B:
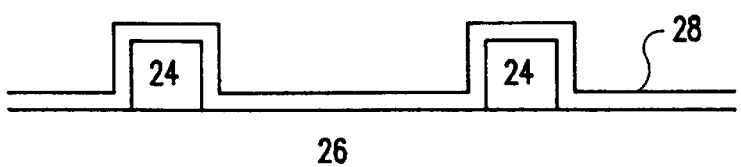

An implementation of this additive process is illustrated in FIGS. 2A–2F, respectively. In FIG. 2A, the formation of metal wiring pattern 24 is shown resulting from the sequential substeps of depositing a metal layer on substrate 26 (e.g., a monocrystalline semiconductor), and standard photolithographic techniques can be used to pattern and mask the metal layer for an etching operation which defines wiring pattern 24. The mask is then stripped and metallized substrate is annealed to crystallize the metallurgy. As shown in FIG. 2B, fluorine-free barrier 28 is then conformally formed over the exposed surface portions of substrate 26 and metal wiring 24. The lower fluorine-free barrier layer 28 can be deposited using a conventional insulator film forming process, such as chemical vapor deposition (CVD), plasma enhanced chemical vapor deposition (PECVD), low pressure chemical vapor deposition (LPCVD), HDPCVD, or physical vapor deposition (PVD), and the like. The fluorine-free barrier layer material can be, for example, silicon, silicon dioxide, silicon nitride, or carbon. The thickness of the fluorine-free barrier layer must be greater than 1 nm, and preferably greater than about 5 nm, and there is no upper limit on the thickness from a practical or technical standpoint. If the fluorine barrier layer is too small in thickness, fluorine can migrate through the barrier layer and undesirably contaminate metal located on the opposite side of the barrier layer.

Figure 2C:
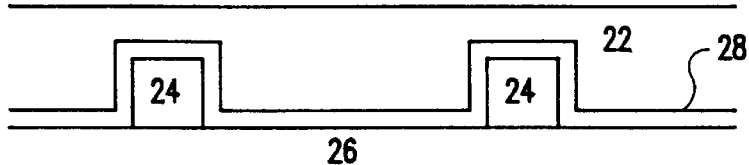
Figure 2D:
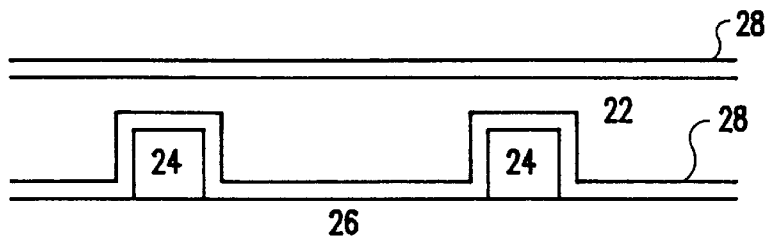

Then, as shown in FIG. 2C, the fluorine rich insulator layer 22 can be deposited by fluorine doping a conventional silicon dioxide or amorphous carbon layer. This doping can be accomplished in situ during formation of the layer by fluorine doping an insulator-film forming gas with a fluorine source, such as $Si_xF_y$ (x and y are positive values), e.g. $SiF_4$, or $C_xF_y$, such as $CF_4$, $CF_6$, $C_2F_6$, $C_6F_{12}$. The insulator-film forming gas can be, e.g., $SiH_4/O_2$, $SiH_4/O_2/Ar$, $SiH_4/N_2O$, or $TEOS/O_2$, such as subjected to a CVD, PECVD, HDPCVD, or PVD process. The preferred embodiments of this invention use $SiF_4$ doped $SiH_4/O_2/Ar$ HDPCVD or $SiF_4$ doped $TEOS/O_2/He$ PECVD to form the fluorine rich insulator layer 22. The thickness of fluorine rich insulator layer 22 is generally formed at a value greater than the thickness of metal wire 24, and less than a factor of three times the metal wire thickness. The fluorine rich insulator layer 22 can be, for example, $SiO_xF_{2-z}$ (where $0<z<2$). This intermediate structure of FIG. 2D typically is polished to ensure planarization before forming additional levels of metallization.

Figure 2E:
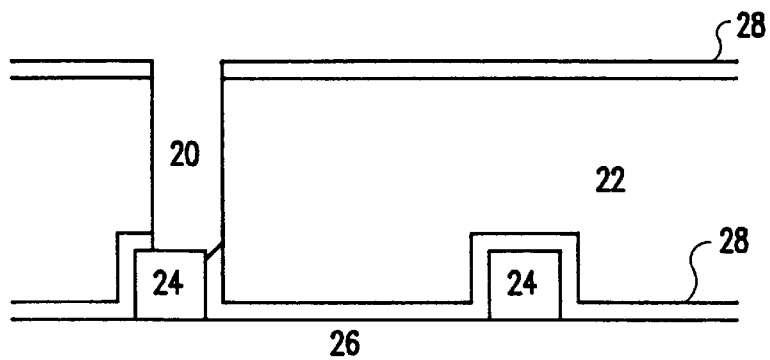

As indicated in FIG. 2E, an upper fluorine-free barrier layer 28 is formed on the polished surface of fluorine rich insulator layer 22. The upper fluorine barrier layer 28 can be formed by any of the same techniques described hereinabove relative to the lower fluorine barrier layer 28. As shown in FIG. 2E, an opening is photolithographically defined in upper fluorine barrier layer 28, and a via 20 is formed by etching through upper fluorine barrier layer 28, fluorine rich insulator layer 22, and lower fluorine barrier layer 28 until metal wire 24 is exposed.

Figure 2F:
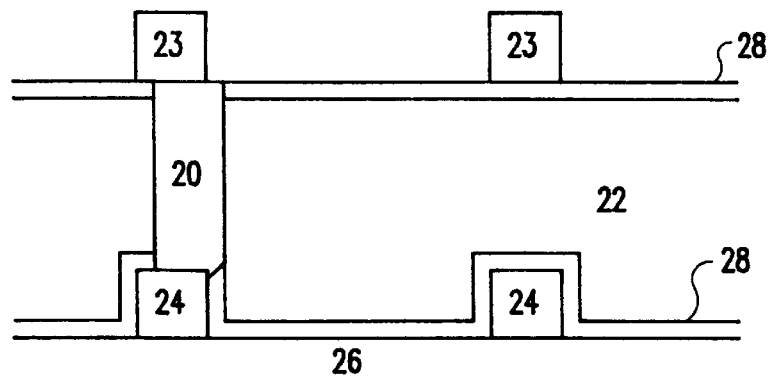

As indicated in FIG. 2F, via 20 can then be filled with a sequence of metals involving, in this order, first titanium, then Ti—N (e.g., by PVD) and lastly tungsten (e.g., by CVD) according to a conventional scheme. The via metal in via 20 preferably is etched and polished (e.g., by CMP) back flat to the surface of barrier film 28. Then, second level metallization 23 can be formed by forming a metal film over the surface of upper barrier film 28 and via 20, patterning and etching the wire 23, and then annealing to crystallize the metallurgy.

As shown in FIG. 2F, the completed metallization includes a tungsten via 20, and the tungsten via 20 interconnects an underlying aluminum wire 24 with an overlying aluminum wire 23 through a $SiO_zF_{2-z}$ layer 22. Each aluminum wire 24 in the first level of metallization as well as the substrate 26 on which they sit has a lower fluorine barrier layer 28 formed thereon. This structure also has the upper fluorine barrier layer 28 serving as the fluorine barrier for the metal plug in the via 20, and metal layer 23. Upper barrier layer 28 protects metallization 23 from fluorine-induced corrosion emanating from fluorine rich insulator 22 during patterning of metallization 23. As a consequence, the adhesion of metal wire 23 to the metal plug in via 20 is improved and the resistance of the metal plug in via 20 is not permitted to grow as fluorine-poisoning of the via metal is precluded by upper barrier film 28.

As discussed above, any metal susceptible to fluorine degradation that is used in IC fabrication will benefit from this invention, and the invention is especially useful in protecting aluminum, aluminum alloy, copper, and copper alloy materials.

Figure 3:
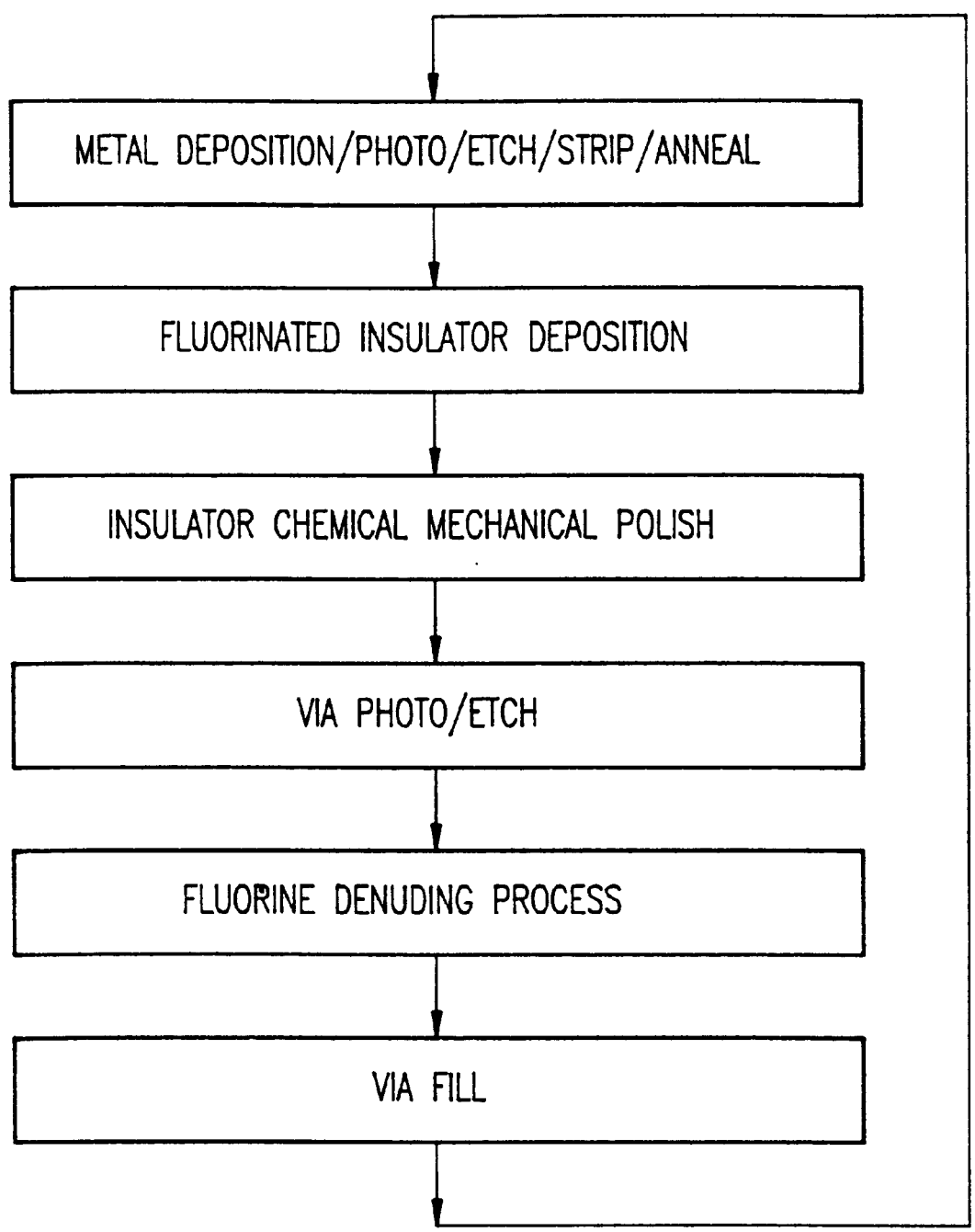
FIG. 3 is a flow chart showing the steps of an embodiment of the invention relating to substantive formation of the flourine barrier layer.

FIG. 3 shows a flow chart of a second embodiment of the inventive method relating to subtractive formation of the fluorine-free barrier layer. The inventive processing sequence as summarized in FIG. 3 proceeds according to the following sequence of steps:

(a) metal wiring pattern formation by the sequentially executed substeps of metal deposition/photolithographic masking/etching/mask stripping/annealing;

(b) fluorinated insulator deposition;

(c) insulator chemical mechanical polish;

(d) via formation by photolithographic masking and etching;

(e) fluorine denuding process;

(f) via filling with metal and second level wiring formation; and repeat steps (a)–(e) for any additional desired levels of metallization.

Figure 4A:
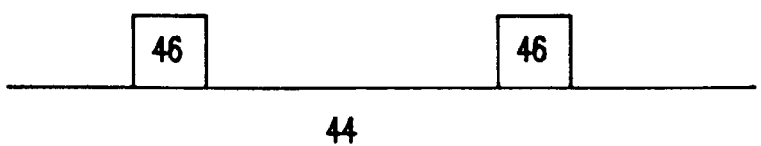
FIGS. 4A–4E show cross-sectional views of the semiconductor device at different stages of a process sequence of a different embodiment of the invention as described in the flow chart of FIG. 3 relating to surface modification of the fluorine-containing layer.
Figure 4B:
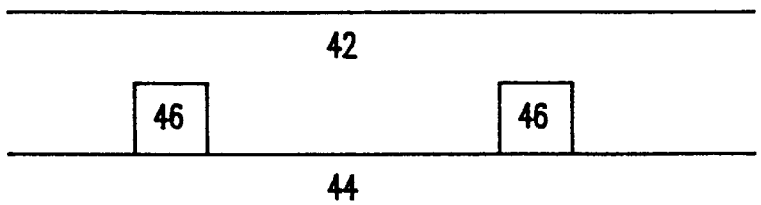
Figure 4C:
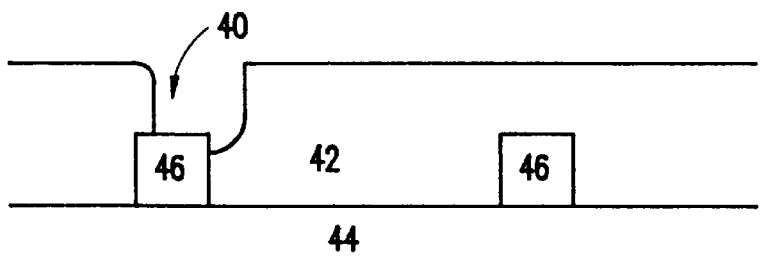
Figure 4D:
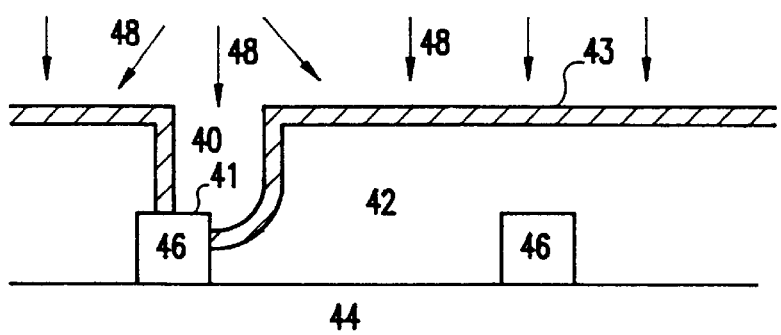
Figure 4E:
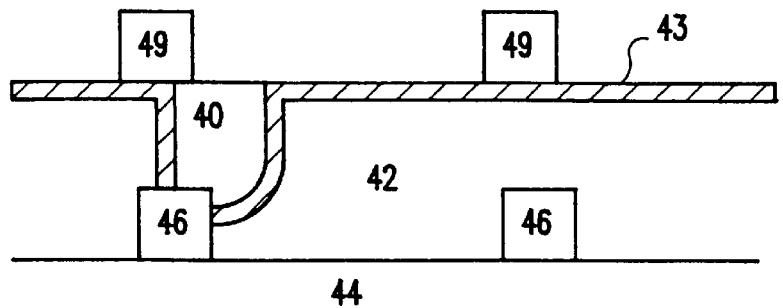

FIGS. 4A to 4E illustrate formation of the fluorine-free barrier by a subtractive approach according to the scheme summarized in FIG. 3, in which fluorine is depleted from a surface region of a fluorine-containing layer. The steps depicted in FIGS. 4A–4B are the same as those shown in FIGS. 2A–2B, respectively, as described above. As seen in FIG. 4C, via 40 is formed in, for example, a $SiO_zF_{2-z}$ insulator 42 (where $0<z<2$) on a substrate 44 (such as a monocrystalline semiconductor). Alternatively, the invention is also applicable to any insulator 42 contaminated with or suspected to be contaminated with fluorine constituents. At the bottom of the via 40 is a metal which can be in the form of a metal wire 46. As illustrated in FIG. 4D, all surfaces are exposed to an ozone plasma 48 to denude fluorine from the surface region 43 of insulator layer 42.

However, it should be understood that the fluorine denuding process alternatively can be effected with a thermally activated or a plasma enhanced gas reaction with the $SiO_zF_{2-z}$ surface such that F is removed therefrom. For thermally activated conditions used to denude fluorine, the surface regions of the fluorine containing layer can be exposed to an environment at 400° C. and $H_2$ or $Ar/H_2$ gas flowed through a furnace tube at atmospheric pressure, for 1 to 60 minutes, preferably about 30 minutes, to denude fluorine. For plasma enhanced gas process conditions used to denude fluorine, the surface regions of the fluorine containing layer can be exposed to a reaction chamber environment of $O_2$ or $O_2/O_3$ plasma in a pressure range of 3 millitorrs to 100 Torr at 400° C. for 10 to 300 seconds, preferably about 60 seconds. More specifically, one exemplary set of conditions for denuding fluorine from the surface regions of the fluorine containing layer uses a feed gas mixture of 400 sccm $O_3$/3600 sccm $O_2$, a reaction chamber temperature of 400° C. and pressure of 30 Torr, and 600 watts rf and 0.7 cm reactor spacing in an Applied Materials P500 Universal CVD chamber. As yet another alternative, it is also contemplated within this invention to use a wet chemical etch process to effectuate the fluorine depletion.

This denuding process depletes surface regions 43 of insulator material 42 of all its fluorine content. The thickness of barrier layer 43 will be function in part of the duration and intensity of the ozone plasma. After its depletion of fluorine, barrier layer 43 prevents fluorine residing in the remainder of insulator layer 42 from being emitted to expose metal surface 41 of metal wire 46, or any metal interconnect and further level of metallization which will be formed in via 40 in contact with metal wire 46.

Figure 5:
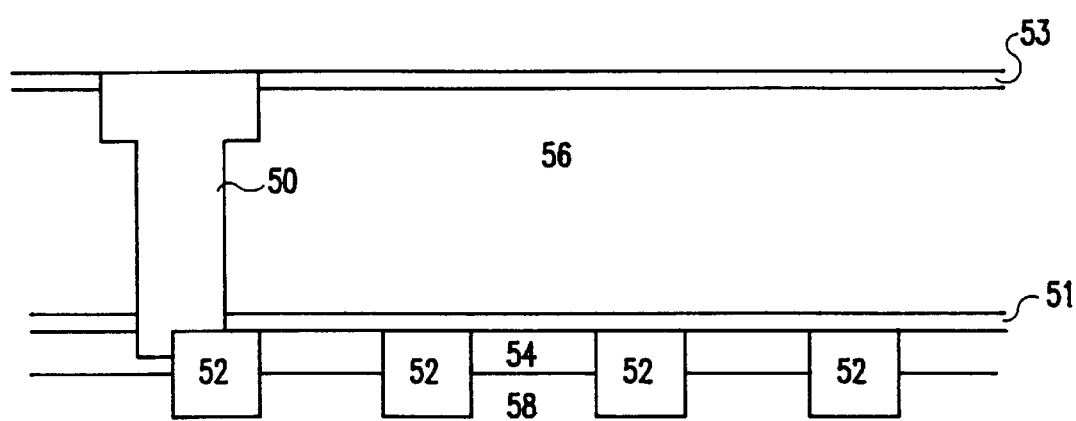
FIG. 5 shows a cross-sectional view of a semiconductor device fabricated by yet another embodiment of the present invention.

FIG. 5 shows yet another formation of an IC structure with, for example, damascene wiring, e.g., damascene Al or Cu wires, and several different implementations of the fluorine barrier layer. Specifically, in this cross section, damascene wires 52 are partially embedded in $SiO_zF_{2-z}$ layer 54. That is, the top halves of these wires 52 are surrounded by $SiO_zF_{2-z}$ layer 54 while their lower halves are partially embedded and surrounded by substrate 58. A fluorine-free $SiO_2$ barrier layer 51 is formed over the top of the wires 52 in the same manner as described for the embodiment of FIGS. 2A–2F before second $SiO_zF_{2-z}$ layer 56 is deposited thereon. Then, a second fluorine-free $SiO_2$ barrier layer 53 is deposited on insulator 56. Barrier layers 53 is opened-up with a mask and etching is used to expose the surface of a metal wire 52 through layers 53/56 and 51 as shown in FIG. 5. An aluminum or copper interconnect can be deposited and formed in via 50 in contact with the upper surface of wires 52 through $SiO_zF_{2-z}$ layer 56.

With reference to FIGS. 4D, and 5, it can be seen that forming a barrier layer at the surfaces of a via or trench sidewalls protects the metallization which will be deposited therein or formed adjacent thereto from fluorine contaminants present in the insulator layer. It will be appreciated that the particular type of formation technique shown for the fluorine barrier layers used in the above examples is merely illustrative, and that either one of the additive or subtractive modes of forming the fluorine barrier layer could be applied to any of the above-exemplified embodiments. It will be recognized that this feature has particular advantages in BEOL technologies where insulator films are intentionally doped with fluorine for the purpose of reducing the dielectric constant of the insulator films in order to reduce capacitive coupling between adjacent metal lines. In this embodiment of the invention, the fluorine-free barrier layer is interposed (either by the additive or subtractive modes of the invention) between the fluorine-rich insulator film and the metal conductor lines to thwart the heightened degradation dangers otherwise posed to metal lines.

While the invention has been described in terms of its preferred embodiments, those skilled in the art will recognize that the invention can be practiced with modification within the spirit and scope of the appended claims.

We claim:

1. A method of improving degradation resistance of metallurgy, comprising the steps of:

providing an insulator film containing fluorine;

removing fluorine from a surface region of said insulator film, said removing step forming a fluorine-free barrier layer on said insulator film containing fluorine; and forming a pattern of metal lines on top of said fluorine-free barrier layer.

2. The method of claim 1, wherein said removing of fluorine from said surface region is accomplished by exposing said surface region to a hydrogen anneal.

3. The method of claim 1, wherein said fluorine-free barrier layer has a thickness ranging from 1 nm to 300 nm.

* * * * *